United States Patent
Aragones Carrete et al.

(10) Patent No.: US 10,368,465 B2
(45) Date of Patent: Jul. 30, 2019

(54) ELECTRICAL UNIT

(71) Applicant: Lear Corporation, Southfield, MI (US)

(72) Inventors: Alberto Aragones Carrete, Valls (ES); Enric Aparicio Rollan, Valls (ES); Jose Gabriel Fernández Bañares, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 15/697,902

(22) Filed: Sep. 7, 2017

(65) Prior Publication Data

US 2019/0075678 A1    Mar. 7, 2019

(51) Int. Cl.
| | |
|---|---|
| *H05K 7/20* | (2006.01) |
| *H05K 1/11* | (2006.01) |
| *H01R 9/24* | (2006.01) |
| *B60R 16/023* | (2006.01) |
| *H02S 40/34* | (2014.01) |

(52) U.S. Cl.
CPC ......... *H05K 7/205* (2013.01); *B60R 16/0238* (2013.01); *H01R 9/2458* (2013.01); *H02S 40/345* (2014.12); *H05K 1/119* (2013.01); *H05K 2201/0999* (2013.01)

(58) Field of Classification Search
CPC ............ H05K 7/205; H05K 1/119; H05K 2201/0999; H02S 40/345; H01R 9/2458; B60R 16/0238; H02G 5/10; H02G 5/00; H02B 1/42; H02B 1/26; H02H 7/22
USPC ....... 361/611, 624, 637, 675, 676, 775, 748, 361/704, 707, 713
See application file for complete search history.

(56) References Cited

U.S. PATENT DOCUMENTS

| | | |
|---|---|---|
| 5,023,752 A | 6/1991 | Detter et al. |
| 5,310,353 A | 5/1994 | Parrish et al. |
| 5,764,487 A | 6/1998 | Natsume |
| 5,822,189 A * | 10/1998 | Isshiki ............... B60R 16/0238 361/736 |
| 6,015,302 A | 1/2000 | Butts et al. |
| 6,325,640 B1 | 12/2001 | Kasai |
| 6,348,662 B1 * | 2/2002 | Kobayashi ........... H01R 9/2466 174/261 |
| 8,027,168 B2 * | 9/2011 | Senk ................... B60R 16/0238 174/387 |
| 8,934,264 B2 | 1/2015 | Durfee et al. |
| 9,266,434 B2 | 2/2016 | Girard et al. |
| 9,475,437 B2 | 10/2016 | Fassnacht |
| 9,616,829 B2 | 4/2017 | Stern et al. |

(Continued)

FOREIGN PATENT DOCUMENTS

DE    102007042174 A1    3/2009

*Primary Examiner* — Anatoly Vortman
*Assistant Examiner* — Stephen S Sul
(74) *Attorney, Agent, or Firm* — Fishman Stewart PLLC

(57) ABSTRACT

An electrical unit includes a thermally conductive housing, an electrically insulating frame disposed in the thermally conductive housing, a plurality of bus bars disposed at least partially between a base wall of the thermally conductive housing and a first side of the electrically insulating frame, and a plurality of electrical components connected to a second side of the electrically insulating frame. At least one bus bar of the plurality of bus bars may be connected to the electrically insulating frame via one or more plastic rivets. Thermally conductive material may be disposed between at least one bus bar of the plurality of bus bars and a wall of the housing.

19 Claims, 10 Drawing Sheets

(56) References Cited

U.S. PATENT DOCUMENTS

| | | | |
|---|---|---|---|
| 9,944,195 B2 | 4/2018 | Stimm et al. | |
| 10,189,355 B2 | 1/2019 | Thomas et al. | |
| 10,211,657 B2 | 2/2019 | Capers | |
| 2007/0177356 A1* | 8/2007 | Panek | G06F 1/20 361/712 |
| 2008/0259586 A1* | 10/2008 | Hosokawa | B60R 16/0239 361/813 |
| 2008/0310121 A1* | 12/2008 | Yamashita | H01R 9/226 361/720 |
| 2011/0103021 A1* | 5/2011 | Janssen | C08K 3/04 361/714 |
| 2012/0200988 A1* | 8/2012 | Uchida | B60R 16/02 361/624 |
| 2012/0202367 A1* | 8/2012 | Uchida | H01R 9/226 439/212 |
| 2014/0085839 A1* | 3/2014 | Nakano | H05K 5/0052 361/752 |
| 2014/0141287 A1 | 5/2014 | Bertucci et al. | |
| 2014/0204533 A1* | 7/2014 | Abeyasekera | H01L 23/3735 361/699 |
| 2014/0273554 A1* | 9/2014 | Sugimoto | B60R 16/0238 439/76.2 |
| 2014/0339892 A1 | 11/2014 | Gendlin et al. | |
| 2016/0141584 A1 | 5/2016 | Eichorn | |
| 2016/0190841 A1 | 6/2016 | Galamb | |
| 2016/0336770 A1 | 11/2016 | Benz et al. | |
| 2017/0238411 A1* | 8/2017 | Kobayashi | H05K 1/0204 361/705 |
| 2018/0334116 A1 | 11/2018 | Sanvito et al. | |

* cited by examiner

ELECTRICAL UNIT

TECHNICAL FIELD

The present disclosure generally relates to electrical units, including electrical power distribution boxes that may be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical units may be larger and/or more complex to assemble than desirable. In some circumstances, electrical components in electrical units may generate heat and increase a temperature inside an electrical unit above a desired level.

There is a desire for solutions/options that minimize or eliminate one or more challenges or shortcomings of electrical units. The foregoing discussion is intended only to illustrate examples of the present field and should not be taken as a disavowal of scope.

SUMMARY

In embodiments, an electrical unit may include a thermally conductive housing, an insulating frame disposed in the thermally conductive housing, a plurality of bus bars disposed at least partially between a base wall of the thermally conductive housing and a first side of the insulating frame, and/or a plurality of electrical components connected to a second side of the insulating frame. At least one bus bar of the plurality of bus bars may be connected to the insulating frame via one or more plastic rivets. Thermally conductive material may be disposed between at least one bus bar of the plurality of bus bars and wall of the thermally conductive housing. A thermally conductive material may be thermally conductive, may be electrically isolating, and/or may include adhesive properties. An insulating frame may include an outer wall extending from the first side and in contact with the base wall of the thermally conductive housing.

With embodiments, at least one bus bar of the plurality of bus bars includes a base section connected to the first side of the insulating frame, an angled section extending through the insulating frame, and a connection section disposed at the second side of the insulating frame and connected with at least one electrical component of the plurality of electrical components. An electrical unit may include a circuit board. An insulating frame may include a plurality of mounting posts supporting a circuit board above a base of the insulating frame. At least one bus bar of the plurality of bus bars may include a current capacity of at least 350 amps.

In embodiments, a plurality of protrusions may extend from the thermally conductive housing and the insulating frame may be connected to the thermally conductive housing via the plurality of protrusions. The protrusions may be electrically insulating and/or thermally conducting. A thermally conductive and electrically insulating material may connect at least one bus bar of the plurality of bus bars to the base wall of the thermally conductive housing. At least one bus bar of the plurality of bus bars may include stamped metal. A first side of the insulating frame may include a plurality of bus bar walls electrically isolating the plurality of bus bars. A minimum thickness of the bus bar walls may correspond to an expected electrical current in the plurality of bus bars. A height of the bus bar walls may correspond to an expected electrical current. Base sections of the plurality of bus bars may be disposed substantially in a common plane. Base sections may be disposed in parallel with a base wall of the thermally conductive housing and in parallel with a base of the insulating frame.

In embodiments, a method of assembling an electrical unit may include providing an insulating frame having a first side and a second side; connecting a plurality of electrical components to the first side of the insulating frame; connecting a plurality of bus bars to the second side of the insulating frame; providing a thermally conductive housing having a base wall; and/or connecting the bus bars to the base wall of the thermally conductive housing. Connecting the bus bars to the base wall of the thermally conductive housing may include providing a thermally conductive and electrically insulating material to at least one of (i) the plurality of bus bars, and (ii) the base wall of the thermally conductive housing.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications and equivalents, which may be included within the spirit and scope of the present disclosure as defined by the appended claims.

Figure 1:
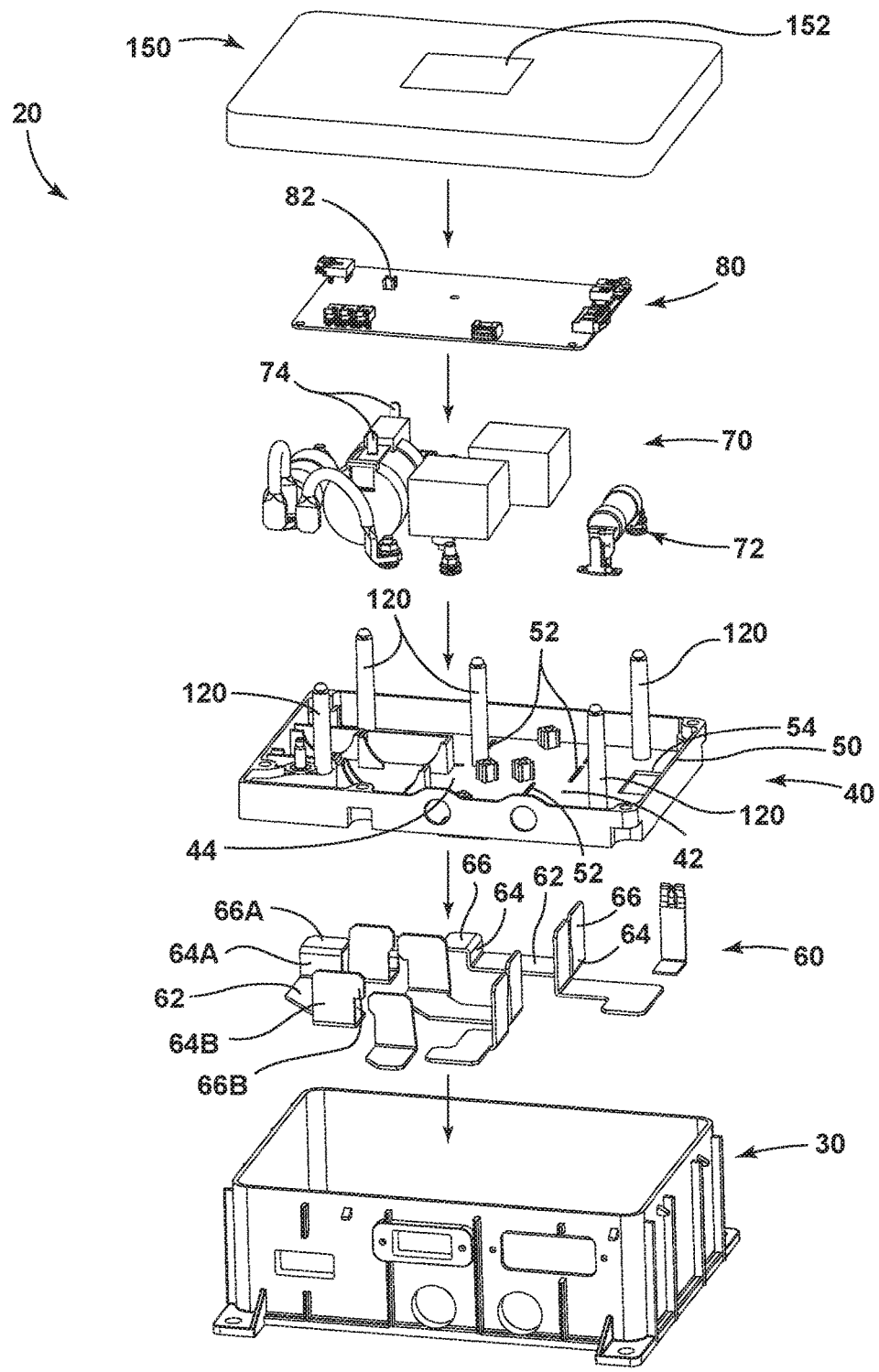
FIG. 1 is an exploded perspective view of an embodiment of an electrical unit according to teachings of the present disclosure.
Figure 2:
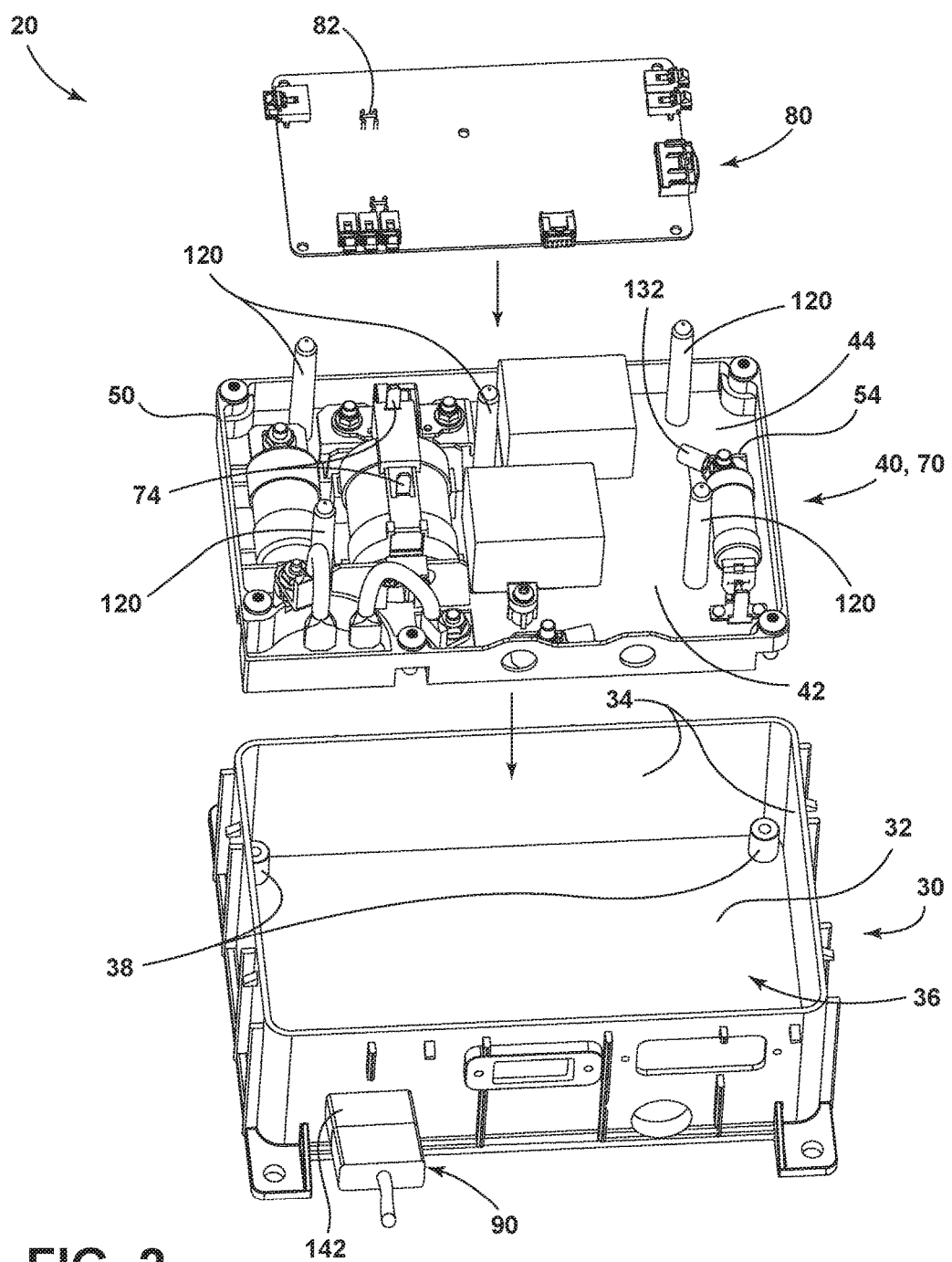
FIG. 2 is an exploded perspective view of an embodiment of an electrical unit according to teachings of the present disclosure.
Figure 3:
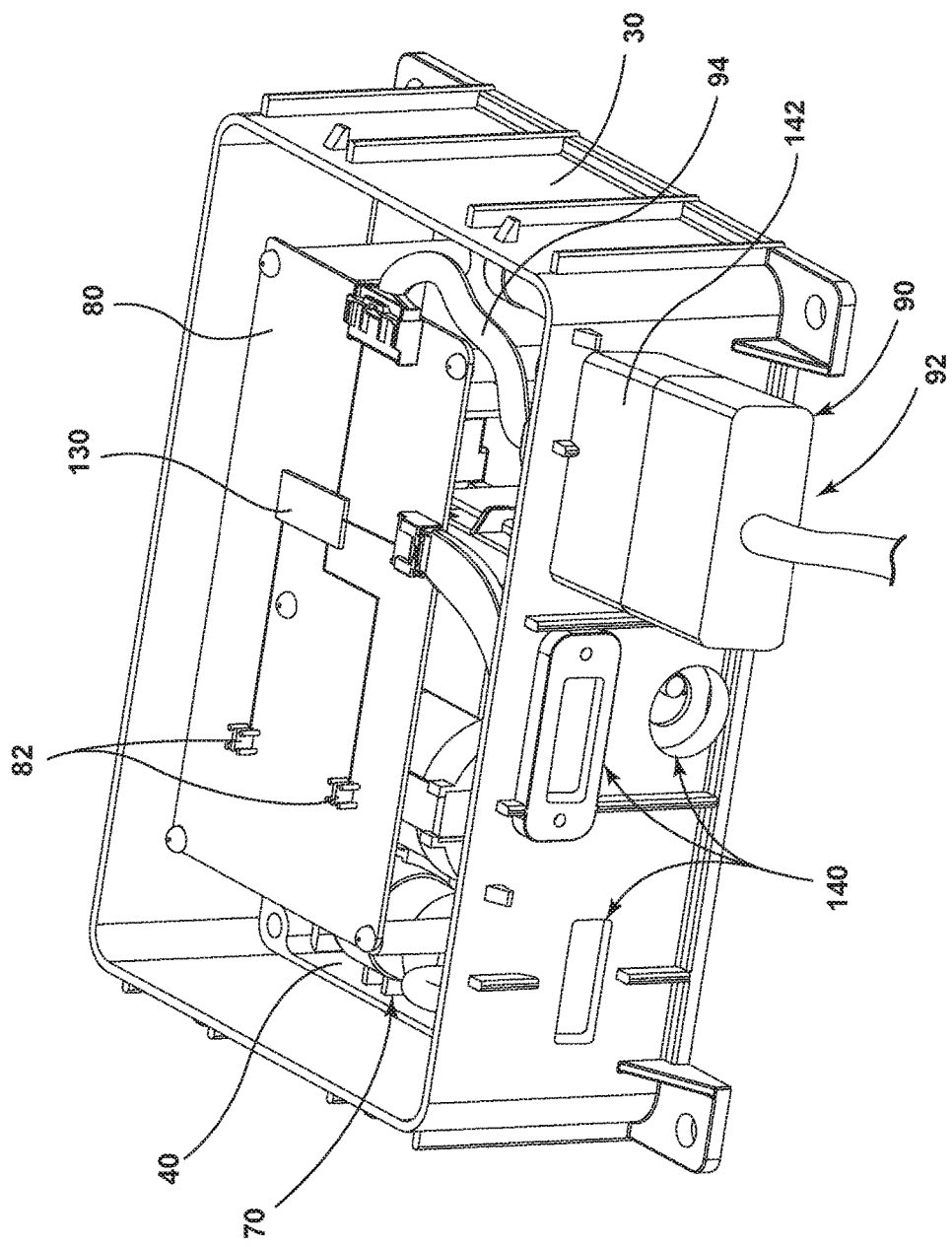
FIG. 3 is a perspective view of an embodiment of an electrical unit according to teachings of the present disclosure.
Figure 4:
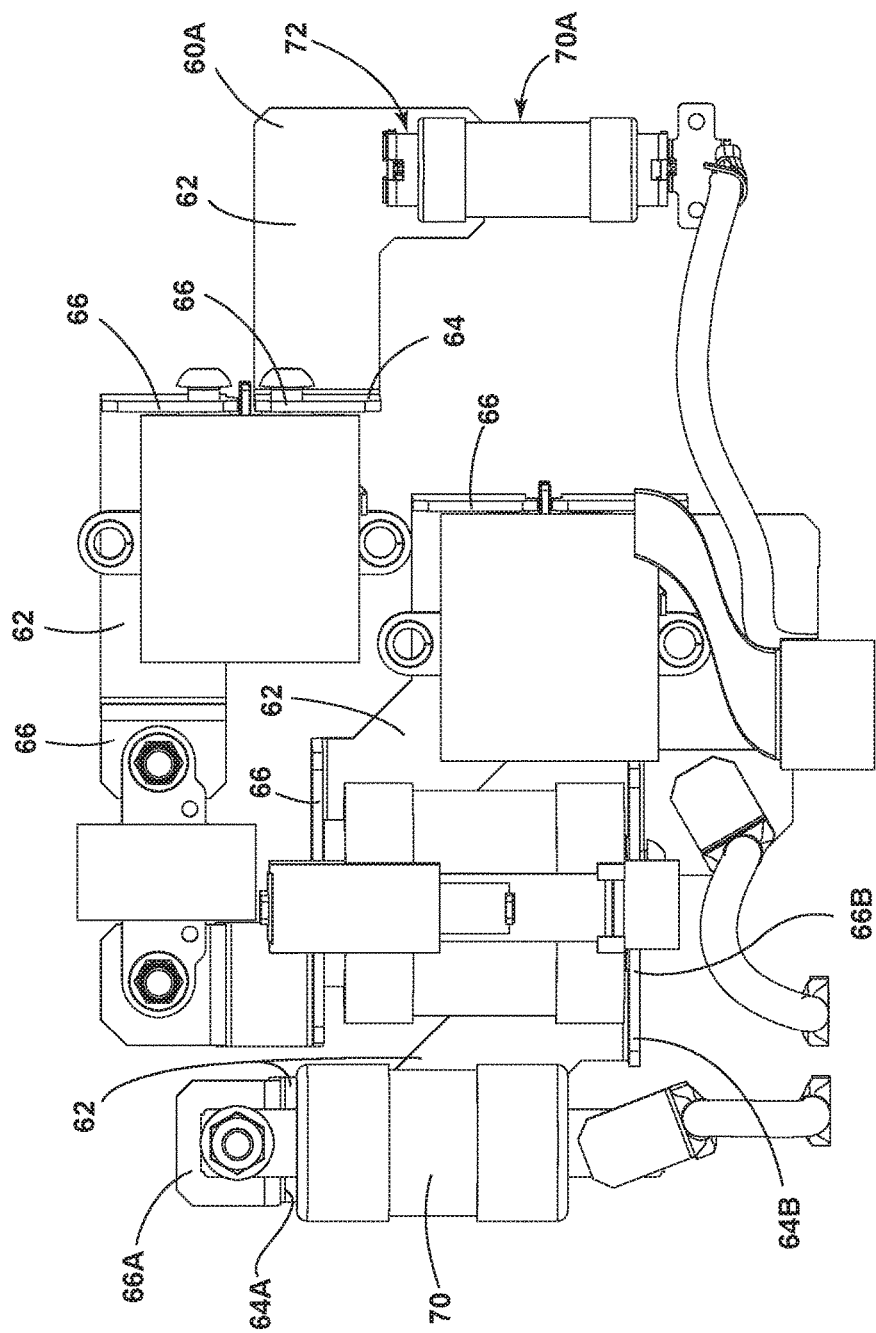
FIG. 4 is a top view of embodiments of electrical components and bus bars, with an insulating frame hidden, according to teachings of the present disclosure.
Figure 6:
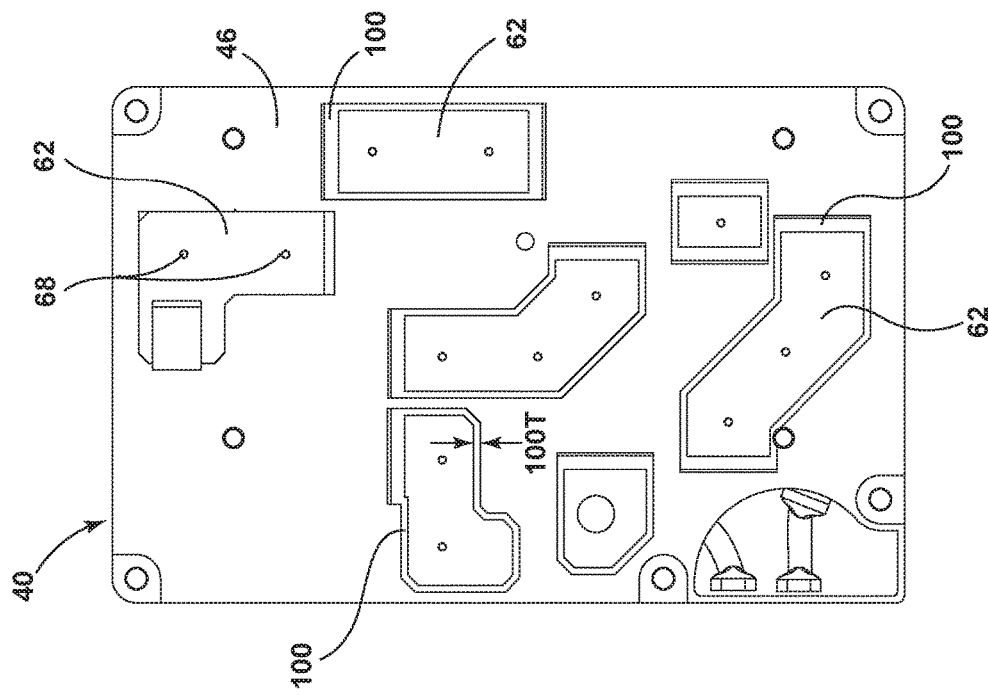
FIG. 6 is a bottom view of embodiments of electrical components, bus bars, and an insulating frame according to teachings of the present disclosure.
Figure 5:
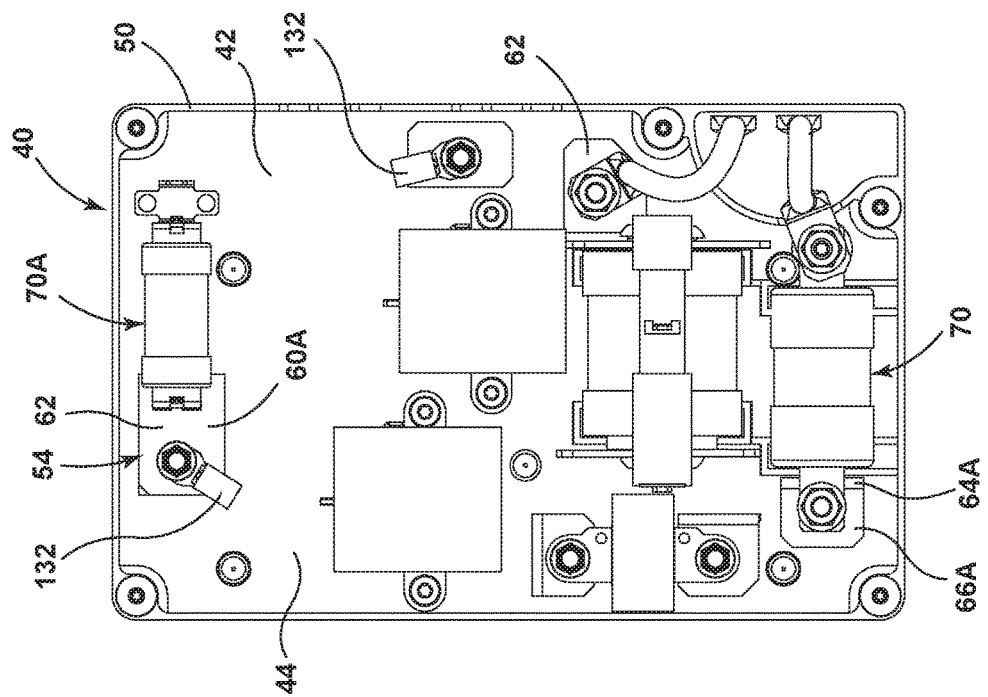
FIG. 5 is a top view of embodiments of electrical components, bus bars, and an insulating frame according to teachings of the present disclosure.
Figure 7:
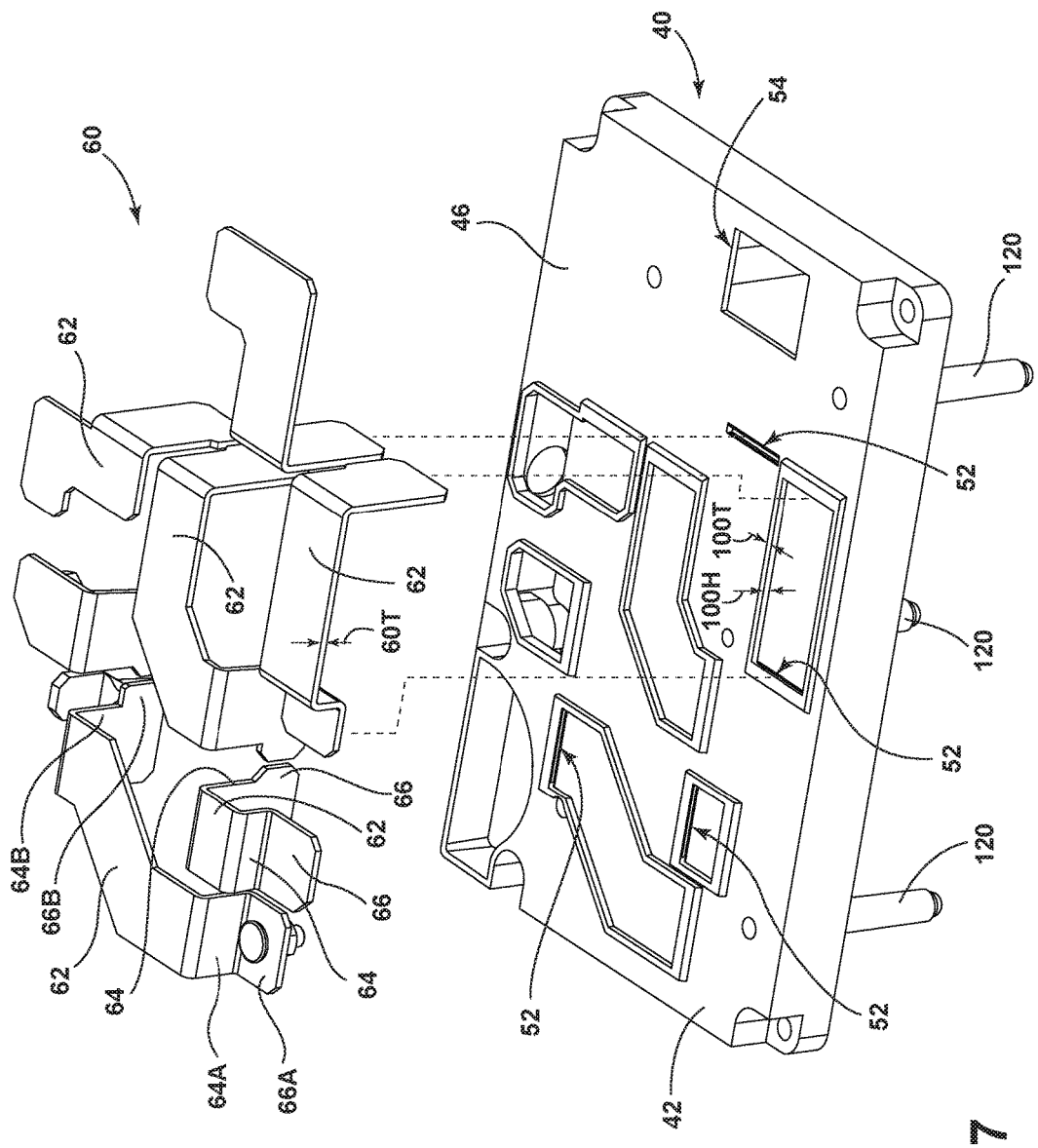
FIG. 7 is an exploded perspective view of embodiments of bus bars and an insulating frame according to teachings of the present disclosure.

In embodiments, such as generally illustrated in FIGS. 1, 2, and 3, an electrical unit 20 may include a housing 30, an insulating frame 40, a plurality of bus bars 60, a plurality of electrical components 70, and/or a circuit board 80.

With embodiments, a housing 30 may include one or more of a variety of shapes, sizes, configurations, and/or materials. For example and without limitation, housing 30 may include generally rectangular configuration. Housing 30 may include a base wall 32 and a plurality of side walls 34 that may extend perpendicularly (e.g., vertically) from base wall 32. Side walls 34 and base wall 32 may provide or define an internal space or chamber 36. Insulating frame 40, bus bars 60, and/or electrical components 70 may be disposed partially and/or entirely within chamber 36. Housing 30 may include a thermally conductive material that may be configured to conduct and/or dissipate heat generated by bus bars 60 and/or electrical components 70 (e.g., housing 30 may act as a heatsink). For example and without limitation, housing 30 may comprise one or more metals, such as aluminum. Housing 30 may include one or more formations or protrusions (e.g., protrusions 38) that may be configured to connect housing 30 with insulating frame 40. Protrusions 38 may include thermally conductive material and/or electrically insulating material. Protrusions 38 may, for example, extend perpendicularly/vertically from base wall 32. Protrusions 38 may, for example and without limitation, include a threaded component (e.g., a nut) that may be fixed (e.g., riveted, welded, etc.) to base wall 32. With embodiments, insulating frame 40 may be hot riveted through housing 30 (e.g., through base wall 32).

In embodiments, such as generally illustrated in FIGS. 1, 2, 3, 4, and 5, electrical components 70 may include one or more of a variety of components, such as, for example, fuses, relays, processors, sensors, filters (e.g., electromagnetic compatibility filters), and/or circuit boards. One or more of electrical components 70 may be high voltage components that may be configured to operate with voltages of or exceeding 100 Volts (e.g., 240 Volts, 480 Volts). Additionally or alternatively, one or more electrical components 70 may be low voltage components that may be configured to operate with voltages less than 100 Volts (e.g., 12 Volts, 24 Volts, 48 Volts, etc.). Electrical components 70 may be disposed at and/or connected to a first side 44 of a base 42 of insulating frame 40 (e.g., a top of insulating frame 40).

With embodiments, such as generally illustrated in FIGS. 1, 2, 3, 5, 6, 7, 8, and 9, an insulating frame 40 may include one or more of a variety of shapes, sizes, configurations, and/or materials. Insulating frame 40 may include an insulating material that may be configured to provide electrical and/or thermal insulation. For example and without limitation, insulating frame 40 may include one or more non-conducting plastic materials. Additionally or alternatively, insulating frame 40 may include one or more metal inserts that may, for example, be used in connection with connecting insulating frame 40 to housing 30 (e.g., with protrusions 38). Insulating frame 40 may include a base 42 that maybe substantially planar and/or that may be disposed substantially in parallel with base wall 32 of housing 30. Insulating frame 40 may include a wall 50 (e.g., an outer wall) that may extend (e.g., substantially perpendicularly) from base 42. Wall 50 may extend in a first vertical direction and/or a second, opposite direction from base 42. Wall 50 may contact base wall 32 and/or set base 42 off from base wall 32. Wall 50 may, for example, extend around all or part of a perimeter of base 42. A height 50H of wall 50 below base 42 (e.g., between base 42 and base wall 32) may correspond to a thickness 60T of bus bars 60 (e.g., a maximum thickness) and a desired clearance between bus bars 60 and base wall 32. A desired clearance between bus bars 60 and base wall 32 may correspond to an expected voltage and/or an expected electrical current (e.g., higher currents and voltages may involve larger clearances). For example and without limitation, bus bars 60 may be configured and/or designed to conduct currents of up to or exceeding 350 amps and height 50H of wall 50 may be about 3 mm to about 5 mm. Bus bars may include, for example and without limitation, current capacities of at least 50 amps, such as about 60 amps, about 200 amps, about 350 amps, and or greater current capacities.

With embodiments, bus bars 60 may be configured to provide an electrical connection between electrical elements, such as electrical components 70, a circuit board 80, and/or one or more connectors 90. Bus bars 60 may include one or more generally planar sections. For example and without limitation, one or more bus bars 60 may include base sections 62 that may be disposed in parallel with base 42 of insulating frame 40. Base sections 62 may, for example, be substantially planar and/or substantially horizontal. Base sections 62 may be connected to a second side 46 of base 42 (e.g., a bottom of base 42) and/or may be disposed between insulating frame 40 and base wall 32 of housing 30. For example and without limitation, base sections 62 may be connected to (e.g., adhered or fixed to) second side 46 of base 42 via one or more fasteners (e.g., plastic rivets, metal rivets, screws, clips, etc.) that may or may not be integrally formed with insulating frame 40. In embodiments, base sections 62 of some or all of bus bars 60 may be disposed in substantially the same plane (e.g., a common plane). For example and without limitation, base sections 62 of some or all of bus bars 60 may be disposed in a plane parallel to a plane of base 42 of insulating frame 40 (e.g., a horizontal plane). With embodiments, bus bars 60 may be metal and may be stamped. In embodiments, one or more bus bars 60 may be formed with insulating frame 40 (e.g., during injection molding).

In embodiments, one or more bus bars may include angled sections 64 that may extend from base sections 62. Angled sections 64 may, for example, extend at substantially right or oblique angles relative to base sections 62. Angled sections 64 may extend through corresponding apertures 52 of insulating frame 40, such as to electrically connect with one or more electrical components 70. With embodiments, one or more bus bars 60 may include connection sections 66 that may extend from and/or be incorporated with angled sections 64. Connection sections 66 may be configured for connection with one or more electrical components 70. Connection sections 66 may, for example, extend substantially parallel with base sections 62 and base 42 of insulating frame 40 (e.g., may be generally horizontal). In some configurations, one or more bus bars 60 may include connection sections 66 that may extend substantially perpendicular to base sections 62 (e.g., may be generally vertical). For example and without limitation, a bus bar 60 may include a horizontal connection section 66A at a first end and/or a vertical connection section 66B at a second end. A vertical connection section 66B may include a through-hole that may facilitate connection of a bus bar 60 with an electrical component 70, such as via a pass-through screw, a stamped screw, a stamped nut, and/or a fastener.

In embodiments, one or more portions of an insulating frame 40 (e.g., base 42) may include one or more apertures 52 through which one or more of bus bars 60 may extend, such as, for example, to connect with electrical components 70. For example and without limitation, base 42 may include an aperture 52 for a plurality of angled sections 64 and/or connection sections of bus bars. One or more bus bars 60 may include a first angled section 64A at a first end and a second angled section 64B at a second end. Either or both of a first angled section 64A and a second angled section 64B may extend through corresponding apertures in frame 40.

In some example configurations, base 42 may include one or more apertures 54 through which electrical components 70 (and/or terminals or connectors thereof) may extend to connect with a bus bar 60. For example and without limitation, at least a portion of a terminal 72 of a component 70A may extend through an aperture 54 of base 42 to connect with bus bar 60A, which may not extend into aperture 54 (see, e.g., FIGS. 4 and 5).

With embodiments, such as generally illustrated in FIGS. 6-9, an insulating frame 40 may include one or more bus bar walls 100 that may extend from a second side 46 of insulating frame 40 (e.g., vertically toward base wall 32 of housing 30). For example and without limitation, insulating frame 40 may include sets of bus bar walls 100 for some or all of bus bars 60. At least portions of bus bars 60 (e.g., base sections 62) may be disposed within (e.g., laterally/horizontally) sets of bus bar walls 100. One or more sets of bus bar walls 100 may be disposed according to a shape of a base section 62 of a corresponding bus bar 60. For example and without limitation, bus bar walls 100 may be aligned with, adjacent to, and/or abut bus bars 60. Bus bar walls 100 may include electrically insulating material and/or may be integrally formed with insulating frame 40. Bus bar walls 100 may provide electrical insulation between adjacent bus bars 60. Thicknesses 100T and/or heights 100H of bus bar walls 100 may correspond to an expected voltage and/or current (e.g., higher currents and voltages may involve larger clearances). For example and without limitation, bus bars 60 may be configured and/or designed to conduct currents of up to or exceeding 350 amps and a thickness 100T and/or a height 100H of a bus bar wall 100 may be about 3 mm to about 5 mm. With embodiments, heights 100H of bus bar walls 100 may be similar or substantially the same as a height or heights 50H of walls 50 of insulating frame 40. In embodiments, bus bar walls 100 may or may not be aligned with a particular bus bar 60. For example and without limitation, insulating frame 40 may include one or more bus bar walls 100 that may separate two or more bus bars 60 (see, e.g., common bus bar wall 100A). In embodiments with common bus bar walls, additional thermally conductive material 110 may be utilized. For example and without limitation, a layer of thermally conductive material 110 may be applied to base wall 32 of housing 30.

Figure 8:
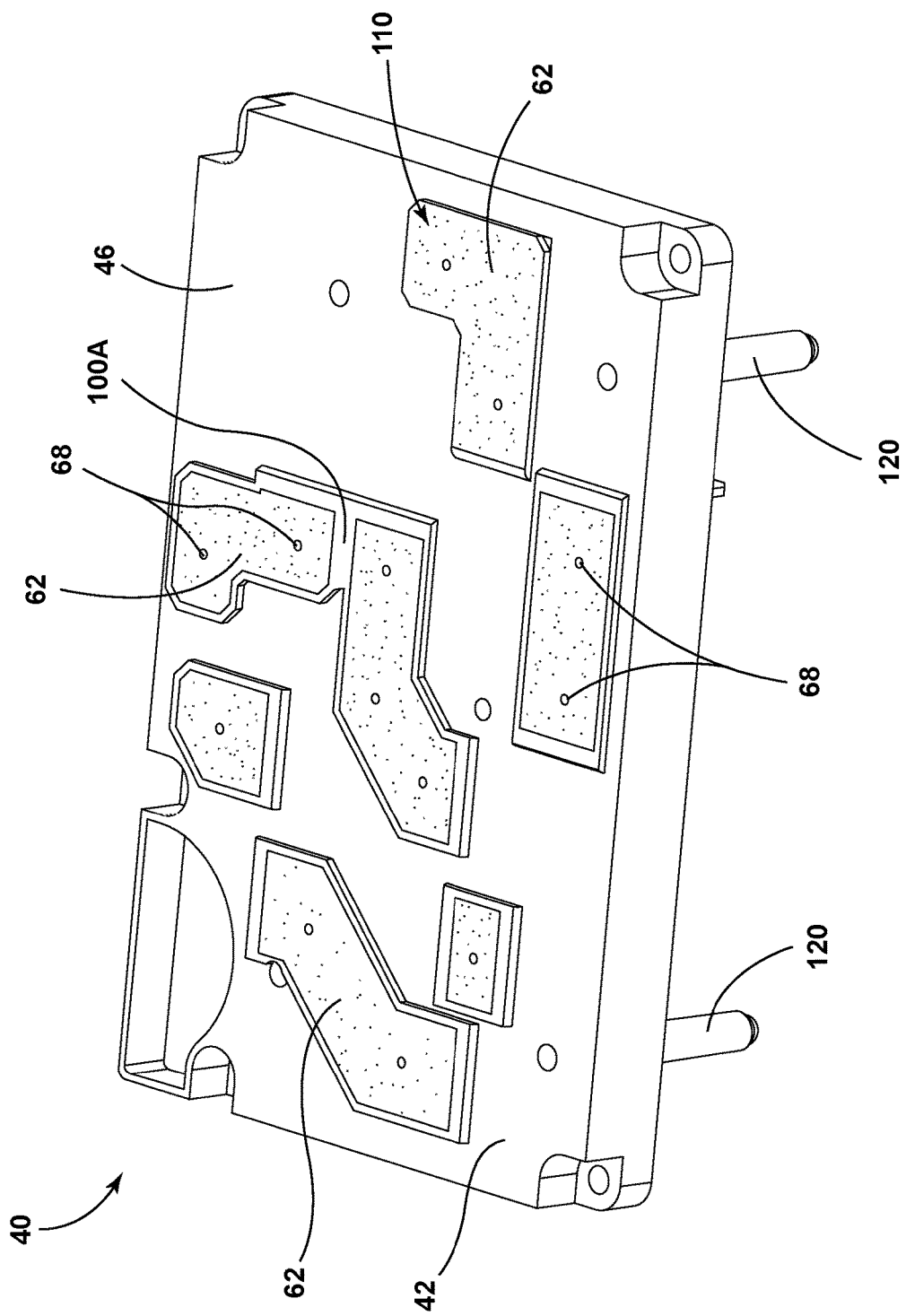
FIG. 8 is a perspective view of embodiments of bus bars and an insulating frame according to teachings of the present disclosure.
Figure 9:
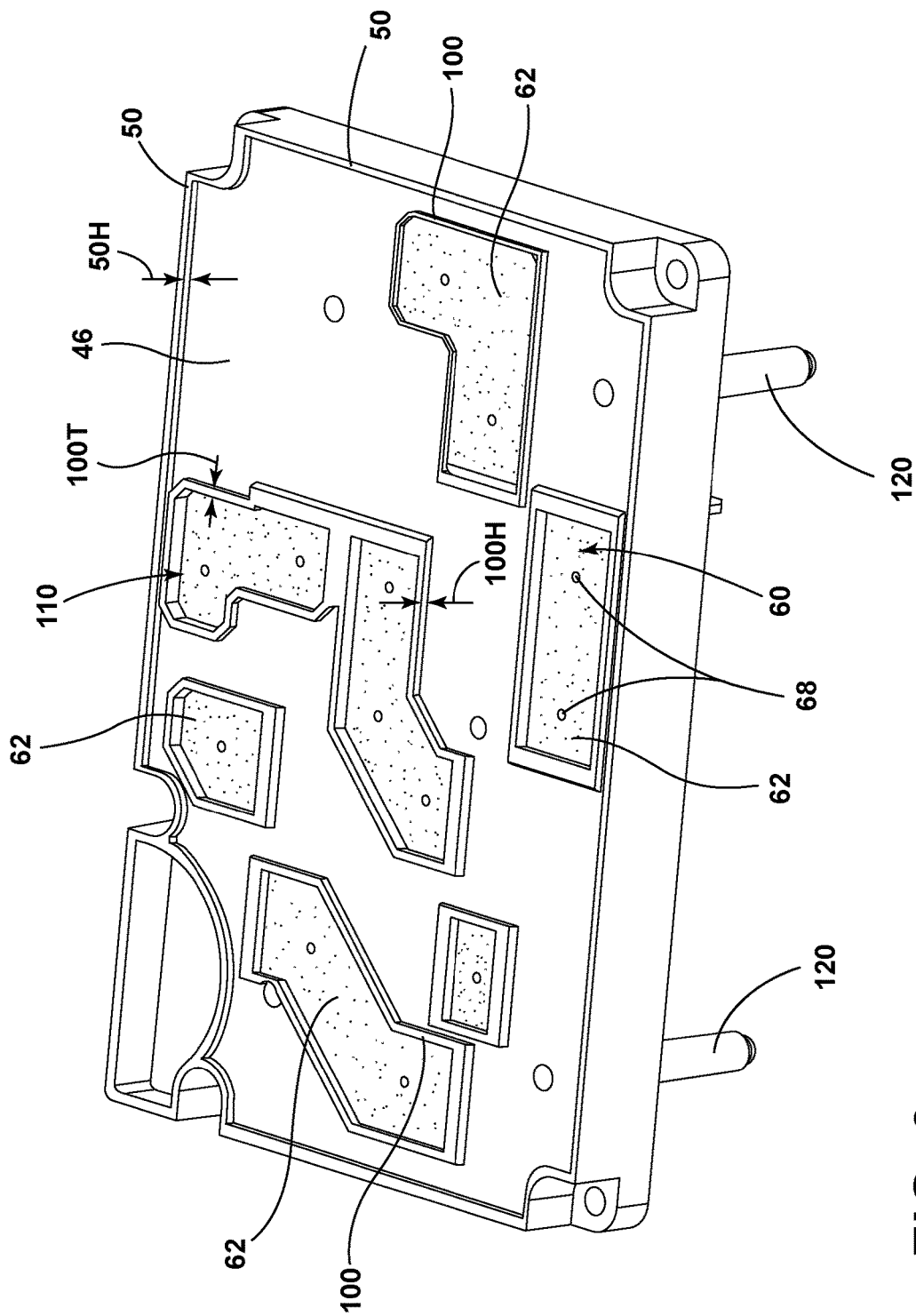
FIG. 9 is a perspective view of embodiments of bus bars and an insulating frame according to teachings of the present disclosure.

In embodiments, such as generally illustrated in FIGS. 8 and 9, one or more bus bars 60 may be connected to a housing 30 such as via a thermally conductive material 110 that may not be electrically conductive (thermal conductive material 110 is generally shown in FIGS. 8 and 9 as a plurality dots for illustrative purposes only and may include a variety of configurations). For example and without limitation, one or more bus bars 60 may be connected (e.g., thermally) to housing 30 via a layer a thermal epoxy paste that may not be electrically conductive. Thermally conductive material 110 may facilitate heat transfer and/or dissipate heat from bus bars 60 by conducting heat to housing 30, which may act as a heat sink. Thermally conductive material 110 may cover substantially an entire bottom surface of a bus bar 60 (e.g., a surface between bus bar 60 and base wall 32). In embodiments, thermally conductive material 110 may be flexible and/or may flow, such as into gaps or micro-gaps to maximize interface contact and/or to minimize thermal path resistance. Thermally conductive material 110 may or may not restrict relative movement between bus bars 60 and housing 30, which may restrict movement of insulating frame 40 relative to housing 30.

With embodiments, an insulating frame 40 may include one or more mounting posts 120 that may extend from base 42 (e.g., vertically away from base wall 32). Mounting posts 120 may include one or more of a variety of shapes, sizes, configurations, and materials, and may be configured to support a circuit board 80, such as above other electrical components 70 connected to base 42. Additionally or alternatively, a circuit board 80 may be supported at least partially between insulating frame 40 and base wall 32 of housing and/or may be supported in a vertical orientation, such as providing circuit board 80 with a bent configuration. Mounting posts 120 may, for example and without limitation, include a generally cylindrical, conical, an/or X-shaped configuration that may include a taper such that a diameter of mounting posts 120 is greater near base 42 and decreases away from base 42. Mounting posts 120 may be integrally formed with insulating frame 40 (e.g., inject molded) as part of a single, monolithic component. In embodiments, one or more electrical components 70 connected to insulating frame 40 may be connected to circuit board 80. For example and without limitation, an electrical component 70 may include one or more electrical terminals 74 (e.g., male terminals) that may connect with one or more corresponding electrical terminals 82 (e.g., female terminals) of circuit board 80. Electrical terminals 74 of an electrical component 70 may, for example, extend at least partially into and/or through circuit board 80. Electrical terminals 82 may be connected (e.g., soldered) to either or both sides of circuit board 80.

With embodiments, an electronic control circuit (ECC) 130 may be connected to circuit board 80 (see, e.g., FIG. 3). ECC 130 may include an electronic controller and/or include an electronic processor, such as a programmable microprocessor and/or microcontroller. In embodiments, ECC 130 may include, for example, an application specific integrated circuit (ASIC). ECC 130 may include a central processing unit (CPU), a memory, and/or an input/output (I/O) interface. ECC 130 may be configured to perform various functions, including those described herein, with appropriate programming instructions and/or code embodied in software, hardware, and/or other medium. In embodiments, ECC 130 may include a plurality of controllers. Electrical unit 20 may include one or more temperature sensors 132 that may be configured to sense a temperature or temperature of or in electrical unit 20. ECC 130 may be connected (e.g., via a wired/physical connection and/or a wireless connection) with temperature sensor(s) 132. ECC 130 may, for example, be configured to monitor a temperature or temperatures of electrical unit 20 and/or to control one or more of electrical components 70 according to a temperature or temperatures of electrical unit 20. ECC 130 may communicate with one or more other ECCs, such as, for example, an ECC configured to control a vehicle or portions/systems of a vehicle.

In embodiments, a housing 30 may include one or more apertures 140 and/or mating connector 142 that may be configured for receiving and/or connecting with an external electrical connector 90. A mating connector 142 may be configured to provide a connection between an external connector 90 and one or more of bus bars 60, electrical components 70, and/or circuit board 80. An electrical connector 90 may connected to and/or part of a wiring harness. One or more internal wires and/or wiring harnesses 94 may connect one or more connectors 90 with one or more of bus bars 60, electrical components 70, and/or circuit board 80, such as via one or more mating connectors 142. An electromagnetic interference (EMI) shield 92 may be connected to housing 30 and/or an electrical ground, such as to facilitate proper shielding functionality. For example and without limitation, EMI shielding 92 may be integrated with connector 90 and/or mating connector 142.

Figure 10:
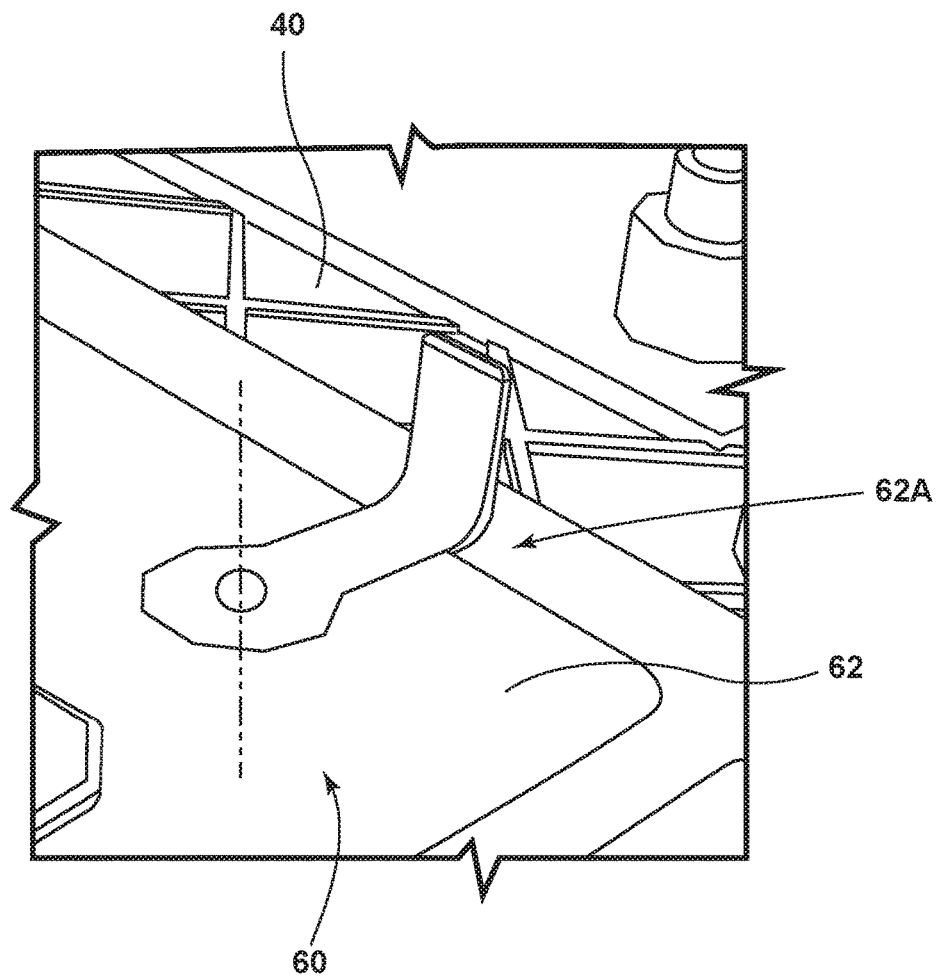
FIG. 10 is a perspective view of portions of an embodiment a bus bar according to teachings of the present disclosure.

With embodiments, such as generally illustrated in FIG. 10, a bus bar extension 62A may extend from a bus bar 60 (e.g., from base section 62). A bus bar extension 62A may, for example, be welded and/or riveted to a base section 62 of a bus bar 60. A bus bar extension 62A may be configured for connection with relatively small electrical components 70 (e.g., a voltage sensor) and/or may be configured for connection with a terminal 82 of a circuit board 80. For example and without limitation, a bus bar extension 62A may include a male configuration configured to be received by a terminal 82 that may include a female configuration.

Figure 11:
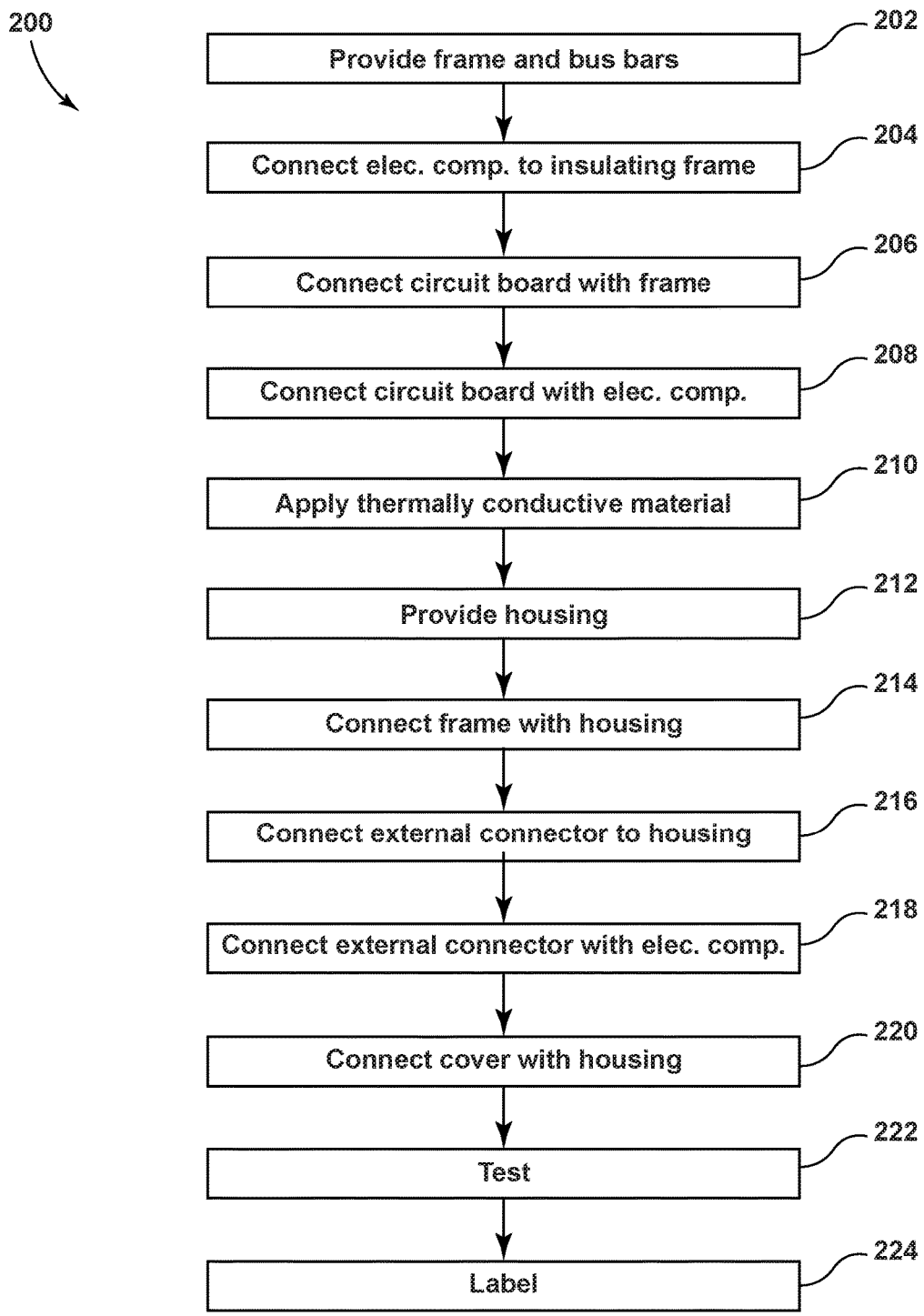
FIG. 11 is a flow diagram of an embodiment of a method of assembling an electrical unit according to teachings of the present disclosure.

With embodiments, such as generally illustrated in FIG. 11, a method 200 of assembling an electrical unit 20 may include providing an insulating frame 40 and one or more bus bars 60 may be connected to insulating frame 40 (step 202). Connecting bus bars 60 to insulating frame 40 may include disposing base sections 62 of bus bars 60 in parallel with a base 62 of insulating frame 40 and connecting base sections 62 to a second/bottom side 46 of base 42 via one or more plastic rivets 68. Connecting bus bars 60 to insulating frame 40 may include inserting angled sections 64 and/or connecting sections 66 through corresponding apertures 52 in insulating frame. One or more electrical components 70, such as fuses and/or relays may be connected to a first/top side 44 of base 42 (e.g., insulating frame 40 may be disposed at least partially between base sections 62 of bus bars 60 and electrical components 70) (step 204). One or more electrical components 70 may be connected to the one or more bus bars 60.

With embodiments, a circuit board 80 may be connected to insulating frame 40, such as via one or more mounting posts 120 of insulating frame 40 (step 206). Mounting posts 120 may be configured to support circuit board 80 above electrical components 70 (e.g., in parallel with base 42 and/or base wall 32). Circuit board 80 may, for example, be connected to insulating frame 40 and/or mounting posts 120 via hot riveting. Circuit board 80 may or may not be bent. Circuit board 80 may be connected to one or more of electrical components 70 (step 208). For example and without limitation, at least one electrical component 70 may include an electrical terminal 74 (e.g., a male terminal) that may connect with a corresponding electrical terminal 82 (e.g., a female terminal) of circuit board 80. An electrical terminal 74 of electrical component 70 may, for example, extend through circuit board 80.

In embodiments, a thermally conductive material 110 may be provided to housing 30 and/or bus bars 60 (step 210). Thermally conductive material 110 may connect bus bars 60 with a base wall 32 of housing 30 and may facilitate heat transfer from bus bars 60 to housing 30. Thermally conductive material 110 may at least temporarily adhere to bus bars 60.

With embodiments, a housing may be provided (step 212) and insulating frame 40 may be connected with housing 30, such as via one or more protrusions 38 (step 214). In embodiments, thermally conductive material 110 may not materially restrict movement between bus bars 60 and housing 30, and movement of bus bars 60 relative to housing 30 may be restricted via connections of bus bars 60 with insulating frame 40 and a connection of insulating frame 40 with housing 30. One or more external connectors 90 may be connected to housing 30 (step 216). External connectors 90 may, for example and without limitation, be screwed to housing, include integrated sealing, include integrated shielding, be configured for high voltage use, and/or for low voltage use. External connectors 90 may be connected with bus bars 60, electrical components 70 and/or a circuit board 80, such as via screws and/or wiring (step 218). A cover 150 may be connected with housing 30 and a waterproof seal may be provided between cover 150 and housing 30 (step 220). An electrical unit 20 may be tested, such as for design functionality (step 222) and, if testing is successful, a label 152 may be applied to housing 30 and/or cover 150 (step 224).

In embodiments, an electrical unit 20 may, for example, be utilized in connection with a vehicle, such as an automobile. Relative to other electrical units, an electrical unit 20 may, for example, include fewer wires (e.g., electrical connections may be provided by bus bars), provide better thermal performance (e.g., heat may be more easily transferred and/or dissipated via bus bars 60, thermally conductive material 110, and a thermally conductive housing 30), and/or include fewer screws (e.g., rivets/hot riveting may be used), among other things.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

It is intended that all matter contained in the above description or shown in the accompanying drawings shall be interpreted as illustrative only and not limiting. Changes in detail or structure may be made without departing from the present disclosure.

Furthermore, the mixing and matching of features, elements and/or functions between various examples is expressly contemplated herein so that one of ordinary skill in the art would appreciate from this disclosure that features, elements, and/or functions of one example may be incorporated into another example as appropriate, unless described otherwise, above. Moreover, many modifications may be made to adapt a particular situation or material to the teachings of the present disclosure without departing from the scope thereof. Therefore, it is intended that the present teachings not be limited to the particular examples illustrated by the drawings and described in the specification, but that the scope of the present disclosure will include any embodiments falling within the foregoing description and the appended claims.

What is claimed is:

1. An electrical unit, comprising:
    a thermally conductive housing comprising metal;
    an electrically insulating frame disposed in the thermally conductive housing, the electrically insulating frame including a first side and a second side;
    a plurality of bus bars disposed at least partially between a base wall of the thermally conductive housing and the second side of the electrically insulating frame; and
    a plurality of electrical components connected to the first side of the electrically insulating frame;
    wherein the electrically insulating frame includes a portion extending from the second side and in direct physical contact with the base wall of the thermally conductive housing.

2. The electrical unit of claim 1, wherein at least one bus bar of the plurality of bus bars is connected to the electrically insulating frame via one or more plastic rivets integrally formed with the electrically insulating frame.

3. The electrical unit of claim 1, wherein thermally conductive material is disposed between and in contact with at least one bus bar of the plurality of bus bars and the base wall of the thermally conductive housing to facilitate heat dissipation from the plurality of electrical components through the plurality of bus bars to the thermally conductive housing.

4. The electrical unit of claim 3, wherein the thermally conductive material is thermally conductive and electrically isolating, includes adhesive properties, and is applied to substantially an entire bottom surface of each bus bar of the plurality of bus bars.

5. The electrical unit of claim 1, wherein at least one bus bar of the plurality of bus bars includes a base section connected to the second side of the electrically insulating frame, an angled section extending through the electrically insulating frame, and a connection section disposed at the first side of the electrically insulating frame and connected with at least one electrical component of the plurality of electrical components.

6. The electrical unit of claim 1, wherein the metal is aluminum.

7. The electrical unit of claim 6, including a circuit board; wherein the electrically insulating frame includes a plurality of mounting posts supporting the circuit board above a base of the electrically insulating frame.

8. The electrical unit of claim 1, wherein at least one bus bar of the plurality of bus bars includes a current capacity of at least 50 amps.

9. The electrical unit of claim 1, including a plurality of formations or protrusions extending from the thermally conductive housing; wherein the electrically insulating frame is connected to the thermally conductive housing via the plurality of formations or protrusions.

10. The electrical unit of claim 9, wherein the formations or protrusions are electrically insulating and thermally conducting.

11. The electrical unit of claim 1, wherein an electrical component of the plurality of electrical components includes a terminal that extends through an aperture in the electrically insulating frame, and the terminal is connected to a bus bar of the plurality of bus bars.

12. The electrical unit of claim 1, wherein at least one bus bar of the plurality of bus bars is inserted into the electrically insulating frame while the electrically insulating frame is injection molded.

13. The electrical unit of claim 1, wherein the second side of the electrically insulating frame includes a plurality of bus bar walls electrically isolating the plurality of bus bars.

14. The electrical unit of claim 13, wherein a minimum thickness of the bus bar walls corresponds to an expected electrical current associated with the plurality of bus bars.

15. The electrical unit of claim 14, wherein a height of the bus bar walls corresponds to the expected electrical current to ensure a minimum separation distance between the plurality of bus bars and the thermally conductive housing.

16. The electrical unit of claim 1, wherein base sections of the plurality of bus bars are disposed substantially in a common plane.

17. The electrical unit of claim 16, wherein the base sections are disposed in parallel with the base wall of the thermally conductive housing and in parallel with a base of the electrically insulating frame.

18. A method of assembling an electrical unit, the method comprising:
    providing an electrically insulating frame having a first side and a second side;

connecting a plurality of electrical components to the first side of the electrically insulating frame;
connecting a plurality of bus bars to the second side of the electrically insulating frame;
providing a thermally conductive housing having a base wall; and
connecting the bus bars to the base wall of the thermally conductive housing;
wherein the thermally conductive housing comprises metal;
wherein the electrically insulating frame includes a portion extending from the second side and in direct physical contact with the base wall of the thermally conductive housing.

19. The method of claim 18, wherein connecting the bus bars to the base wall of the thermally conductive housing includes providing a thermally conductive and electrically insulating material to (i) the plurality of bus bars, and (ii) the base wall of the thermally conductive housing.

* * * * *